(12) United States Patent
Watanabe et al.

(10) Patent No.: US 9,601,306 B2
(45) Date of Patent: Mar. 21, 2017

(54) SAMPLE MICROMOTION MECHANISM, METHOD OF USING THE SAME, AND CHARGED PARTICLE DEVICE

(71) Applicant: Hitachi, Ltd., Chiyoda-ku, Tokyo (JP)

(72) Inventors: Naruo Watanabe, Tokyo (JP); Yoshio Takahashi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 198 days.

(21) Appl. No.: 14/641,478

(22) Filed: Mar. 9, 2015

(65) Prior Publication Data

US 2015/0255246 A1  Sep. 10, 2015

(30) Foreign Application Priority Data

Mar. 7, 2014 (JP) ................................ 2014-045340

(51) Int. Cl.
  *H01J 37/20* (2006.01)
  *H01J 37/26* (2006.01)
  *G01L 1/22* (2006.01)

(52) U.S. Cl.
  CPC ............ *H01J 37/20* (2013.01); *G01L 1/2262* (2013.01); *H01J 37/261* (2013.01); *H01J 2237/15* (2013.01); *H01J 2237/2002* (2013.01); *H01J 2237/202* (2013.01); *H01J 2237/204* (2013.01); *H01J 2237/2007* (2013.01); *H01J 2237/20292* (2013.01); *H01J 2237/24578* (2013.01); *H01J 2237/24585* (2013.01); *H01J 2237/2602* (2013.01)

(58) Field of Classification Search
  CPC ........ H01J 37/20; H01J 37/261; G01L 1/2262
  See application file for complete search history.

(56) References Cited

U.S. PATENT DOCUMENTS

| 2012/0060353 A1* | 3/2012 | Krampert | ................ H01L 21/68 |
| | | | 29/559 |
| 2014/0026672 A1* | 1/2014 | Matsumoto | .............. G01N 3/02 |
| | | | 73/788 |

FOREIGN PATENT DOCUMENTS

| JP | 2004-259448 A | 9/2004 |
| JP | 2006-114251 A | 4/2006 |
| JP | 2009-081080 A | 4/2009 |

* cited by examiner

*Primary Examiner* — Wyatt Stoffa
*Assistant Examiner* — Sean Luck
(74) *Attorney, Agent, or Firm* — Miles & Stockbridge P.C.

(57) ABSTRACT

A sample micromotion mechanism adapted to minimize an influence of a disturbance and adjust a sample drift rapidly and with high accuracy, and designed so as to be a compact, easy-to-place sample micromotion mechanism of a side-entry type that suppresses the occurrence of the sample drift and generates/displays high-resolution monitoring images and precisely drawn patterns. A charged particle device employing the sample micromotion mechanism operates followed by deformation which causes a strain. A strain measuring unit measures such strain. The sample micromotion mechanism imparts micromotion so as to reduce the strain in accordance with the measured strain value, thereby reducing deformation of the sample micromotion mechanism.

15 Claims, 13 Drawing Sheets

F I G . 1
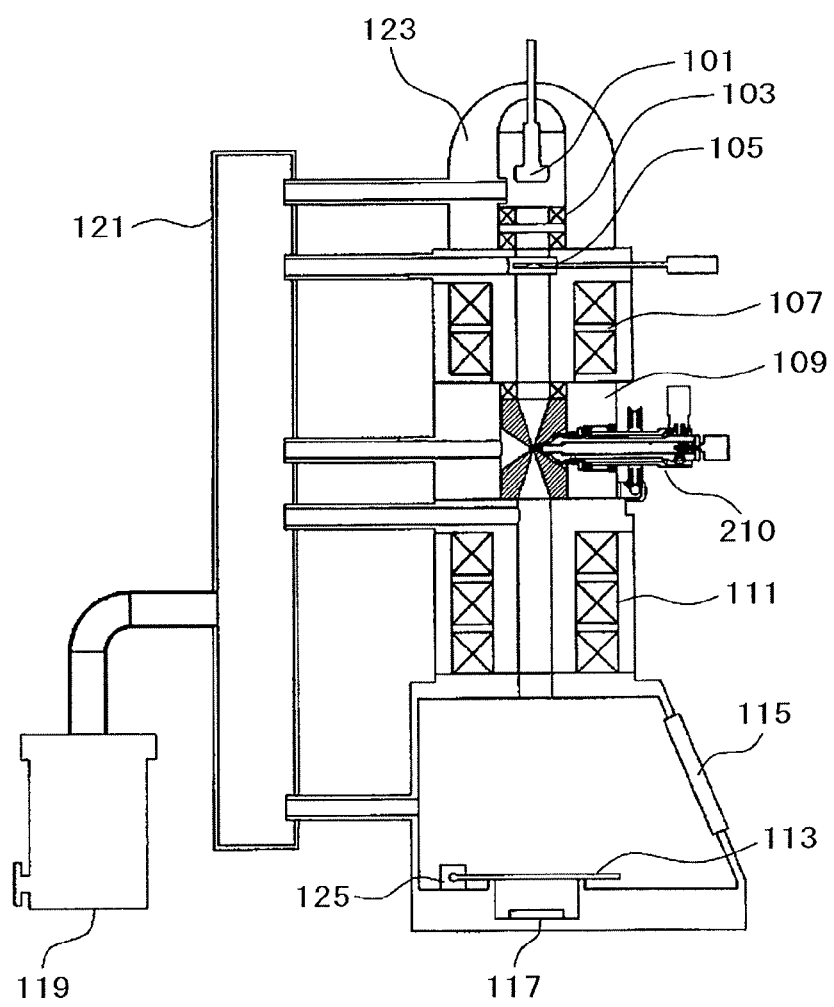

CONTROL VARIABLE OF
MICROMOTION MOTOR 503 OR 505

CONTROL VARIABLE OF
MICROMOTION MOTOR 501

SAMPLE MICROMOTION MECHANISM, METHOD OF USING THE SAME, AND CHARGED PARTICLE DEVICE

CLAIM OF PRIORITY

The present application claims priority from Japanese patent application JP 2014-045340 filed on Mar. 7, 2014, the content of which is hereby incorporated by reference into this application.

BACKGROUND OF THE INVENTION

Field of the Invention

The present invention relates generally to sample micromotion mechanisms, methods of using the same, and charged particle devices. More particularly, the invention relates to sample micromotion mechanisms each equipped in a charged particle device that uses charged particle beams, for example, to monitor a surface shape and internal state of a substance or to draw patterns on the substance surface. The invention is further directed to methods of using such a sample micromotion mechanism.

Description of the Related Arts

The charged particle devices that use charged particle beams to monitor a surface shape and internal state of a substance or to draw patterns on the substance surface can provide high-resolution monitoring images and precisely drawn patterns. Sample micromotion mechanisms employed in such charged particle devices are required to have advantages such as ease of sample-loading operations, wide irradiation angles when used to irradiate a sample with charged particle beams, and wide angles for detecting the charged particle beams reflected/scattered from the surface of the sample. For these reasons, sample micromotion mechanisms called the side-entry type are mainly used in recent years.

In the sample micromotion mechanisms of the side-entry type, after a sample has been positioned, the positioned sample occasionally continues to move slightly. This event is called the sample drift. If the sample drift occurs, a monitoring image will blur, which may cause difficulty in obtaining a fine image, may deform a drawn pattern, and thus may reduce accuracy.

The following techniques are disclosed to suppress the occurrence of the above-discussed sample drift.

JP-A-2009-81080 (Patent Document 1) discloses a method of providing a plurality of places at which a spherical fulcrum and a spherical seat corresponding thereto come into mutual contact, and thereby stabilizing the contact between both and preventing deformation of a sample micromotion mechanism from changing with an elapse of time.

JP-A-2004-259448 (Patent Document 2) discloses a method of reducing deformation of a sample micromotion mechanism due to movement thereof, by using a repulsive force of an O-ring generated by its own deformation.

JP-A-2006-114251 (Patent Document 3) discloses a technique applied to a transmission electron microscope that is one type of charged article device, the technique including a method of moving and/or adjusting a sample micromotion mechanism so as to detect, directly with a sensor, a drift of a pattern of a charged particle beam transmitted through a sample, and correct the drift.

SUMMARY OF THE INVENTION

The techniques discussed above, however, has the following problems.

The method proposed in Patent Document 1 to provide the plurality of places at which the spherical fulcrum and the spherical seat come into mutual contact leaves the problem of sample drift unsolved, if a disturbance occurs that changes the contact state.

The method proposed in Patent Document 2 to reduce the deformation of the sample micromotion mechanism by using the repulsive force of the O-ring generated by its own deformation poses a problem in that if the distance through which the sample micromotion mechanism has moved is too short, probable lack of the repulsion may result in failure to sufficiently reduce the deformation or create a need to spend a great amount of time before the deformation can be reduced to a certain level.

The method proposed in Patent Document 3 to move and/or adjust the sample micromotion mechanism so as to detect the drift directly with the sensor and correct the drift requires a light-receiving time to be extended for pattern detection with the sensor and thus presents a problem in that it takes a long time to complete the correction of the drift by the movement and/or adjustment of the sample micromotion mechanism.

Additionally, if the sample drift occurs after the operations on the sample micromotion mechanism, a person who is observing the state of the substance uses the sample micromotion mechanism to operate its sample micromotion machine through a certain distance in a direction reverse to a previous direction in which the machine operations have been performed up until that time. Such operations are called "counter operations", which tend to be excessive and/or insufficient operations in a manual operation mode.

Furthermore, since the sample micromotion mechanisms of the side-entry type are each placed so as to cross a magnetic field that an objective lens generates, the sample micromotion mechanism itself is reduced in size and makes it difficult to place an element that measures the amount of deformation of the sample micromotion mechanism.

Accordingly, an object of the present invention is to provide a sample micromotion mechanism of the side-entry type that is adapted to minimize an influence of a disturbance and adjust the sample drift rapidly with high accuracy, and that is designed to be compact and easy-to-place. Thus, the occurrence of the sample drift can be suppressed and high-resolution monitoring images and precisely drawn patterns are obtained. The invention is also intended to provide a method of using such a sample micromotion mechanism, and a charged particle device employing the sample micromotion mechanism.

Means for Solving the Problems

Some of major features of the charged particle device in an aspect of the present invention for solving the above problems are outlined below.

The charged particle device includes: a charged particle beam source that generates a charged particle beam; a charged particle optical system that controls a path for the charged particle beam to propagate; a sample holder that supports a sample irradiated with the charged particle beam; a sample micromotion mechanism that imparts micromotion to the sample holder and positions the sample; and a sensor unit that detects the charged particle beam transmitted through the sample; wherein the sample micromotion mechanism includes a strain measuring unit that measures strain in a member constituting the sample micromotion mechanism, and after positioning the sample, the sample micromotion mechanism imparts the micromotion to the sample holder so as to counteract the strain in accordance with the strain measured by the strain measuring unit.

In addition, some of major features of the sample micromotion mechanism in an aspect of the present invention are outlined below.

The sample micromotion mechanism includes: a sample holder that supports a sample observed through a charged particle device; a sliding cylinder that accommodates the sample holder; a micromotion mechanism that imparts micromotion to a distal end portion of the sample holder supporting the sample; and a strain measuring unit that measures the amount of strain occurring between the sliding cylinder and the micromotion mechanism.

Furthermore, some of major features of a usage method for the sample micromotion mechanism in an aspect of the present invention are outlined below.

In the sample micromotion mechanism including a sample holder that supports a sample observed through a charged particle device, a sliding cylinder that accommodates the sample holder, a micromotion mechanism that imparts a micromotion to a distal end portion of the sample holder supporting the sample, and a strain measuring unit that measures the amount of strain occurring between the sliding cylinder and the micromotion mechanism, the micromotion mechanism employs a sample micromotion mechanism that includes a rotary mechanism to impart a rotation to the distal end portion of the sample holder, a horizontal micromotion mechanism to impart to the distal end portion a micromotion directed along a lateral surface of the sliding cylinder, and a microswinging motion mechanism to swing the distal end vertically and horizontally about a central axis of the sample holder; wherein the method of using the sample micromotion mechanism includes (1) operating the sample micromotion mechanism and positioning the sample holder, (2) stopping the operation of the sample micromotion mechanism after the positioning, (3) blocking a charged particle beam generated by the charged particle device, (4) activating the rotary mechanism to minimize the strain caused by deformation of the sliding cylinder, (5) activating the microswinging motion mechanism to swing the distal end vertically and horizontally for minimizing the strain caused by the deformation of the sliding cylinder, (6) activating the horizontal micromotion mechanism to impart micromotion in a horizontal direction for minimizing the strain caused by the deformation of the sliding cylinder, (7) minimizing the strain caused by the deformation of the sliding cylinder, and (8) releasing a blocked state of the charged particle beam.

In accordance with the present invention, the sample micromotion mechanism can be provided that is adapted to minimize the influence of a disturbance and adjust the sample drift rapidly and with high accuracy, and designed so as to be the compact, easy-to-place sample micromotion mechanism of the side-entry type that suppresses the occurrence of the sample drift and generates/displays high-resolution monitoring images and precisely drawn patterns. In addition, the method of using the sample micromotion mechanism, and the charged particle device employing the sample micromotion mechanism can be provided.

BRIEF DESCRIPTION OF THE DRAWINGS

FIG. 1 is a cross-sectional view of a transmission electron microscope having a sample micromotion mechanism according to the present invention.

DETAILED DESCRIPTION OF THE PREFERRED EMBODIMENTS

Figure 2:
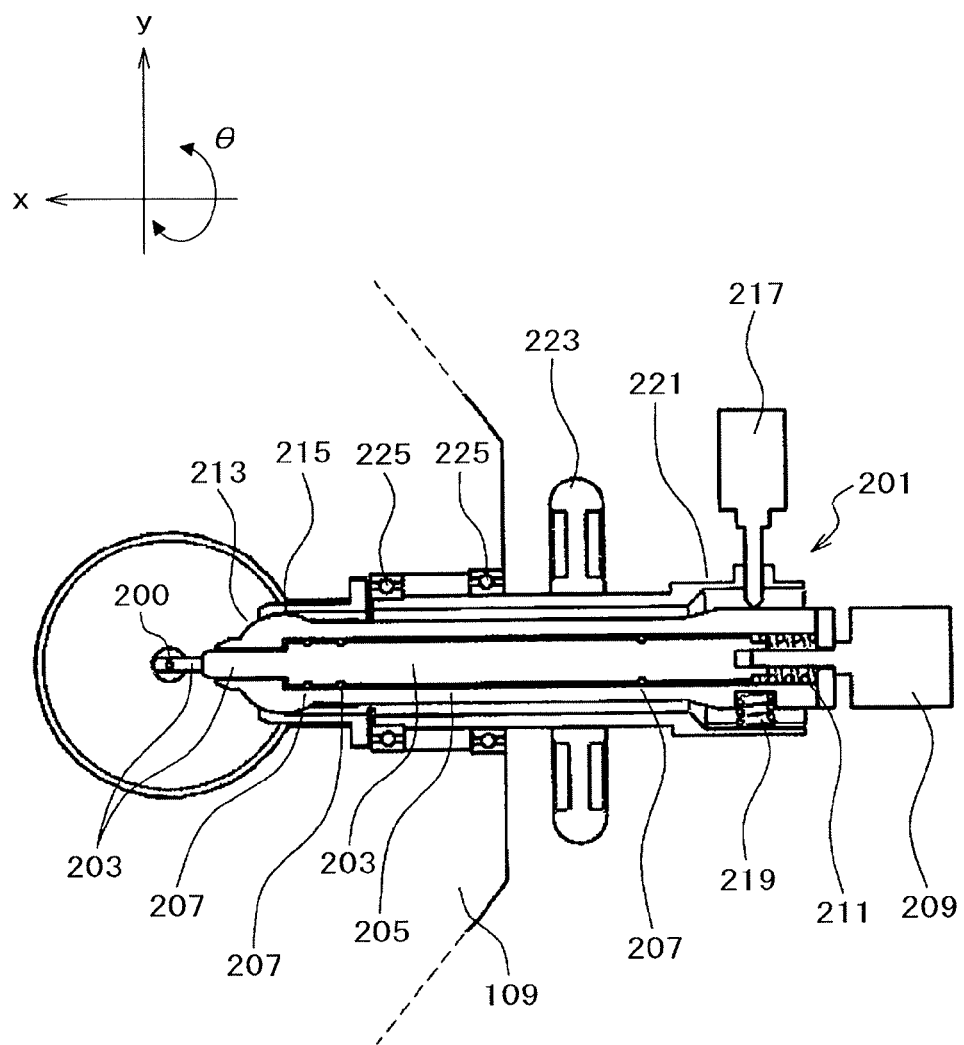
FIG. 2 is a sectional view of a sample micromotion mechanism of a charged particle device shown and described as a first embodiment of the present invention.

The following describes embodiments of the present invention. More specifically, the description is given of a configuration, functions, and advantageous effects of each of the embodiments as achieved when a sample micromotion mechanism of the invention is installed in a charged particle device, especially a transmission electron microscope. Substantially the same effects can also be obtained in a scanning electron microscope and focused-ion-beam machining device including a sample micromotion mechanism similar to that of the invention.

First Embodiment

The configuration, functions, and advantageous effects of a first embodiment of the present invention are described below referring to FIGS. 1 to 11.

FIG. 1 is a cross-sectional view of a transmission electron microscope having a sample micromotion mechanism according to the first embodiment of the present invention. A housing 123 is connected to a vacuum pump 119 via a vacuum tube 121 and includes a high-vacuum region there-inside. In the housing 123, an aligning coil 103 adjusts a direction in which an electron beam emitted from a charged particle source 101 is to travel, and then an aperture 105 adjusts a spread of the electron beam. After these adjustments, a focusing lens 107 adjusts a direction of the electron beam so that the beam focuses upon a very small region of a sample (not shown) that is supported by a sample micromotion mechanism 201 in a magnetic field which an objective lens 109 generates. After being transmitted through the sample, the electron beam is enlarged by the magnetic field that the objective lens 109 has generated. The electron beam is further enlarged by a projection lens 111 that follows the objective lens 109, and projected on a fluorescent screen 113. A pattern image of the electron beam which has been converted into visible light on the fluorescent screen 113 is visually observed from an observation hole 115 and/or recorded with a camera (not shown). Alternatively, the fluorescent screen 113 is directed away from an irradiation path of the electron beam via a hinge 125, then the pattern image of the electron beam is converted into visible light using any other kind of detector, for example a scintillator, and this visible light is recorded with a CCD camera 117.

FIG. 2 is a sectional view of the sample micromotion mechanism according to the first embodiment of the present invention, the sectional view representing a section in the direction that the electron beam is transmitted through the sample.

A sample holder 203 holds the sample 200 at its distal end, and places the sample 200 in the magnetic field generated by the objective lens 109. The sample holder 203, supported by O-rings 207 inside a sliding cylinder 205, moves in an x-direction by means of a micromotion screw 209 and a spring 211, thereby positioning the sample.

While internally retaining the sample holder 203, the sliding cylinder 205 moves by leverage with a sliding section as a pivot point, the sliding section including a spherical fulcrum 213 and a spherical seat 215. In addition, the sliding cylinder 205 moves in a y-direction by means of a micromotion screw 217 and a spring 219, thereby positioning the sample 200. Furthermore, while internally retaining the sample holder 203, the sliding cylinder 205 moves in a z-direction by means of a micromotion screw (not shown) and a spring (not shown) by the leverage motion with the above sliding section as the pivot point, and thereby positions the sample 200.

While internally retaining the sliding cylinder 205, an entire rotary cylinder 221 rotates in a theta (θ) direction via bearings 225 placed between the rotary cylinder 221 and the objective lens 109, and thereby positions the sample.

Strain Measuring Elements

Figure 3:
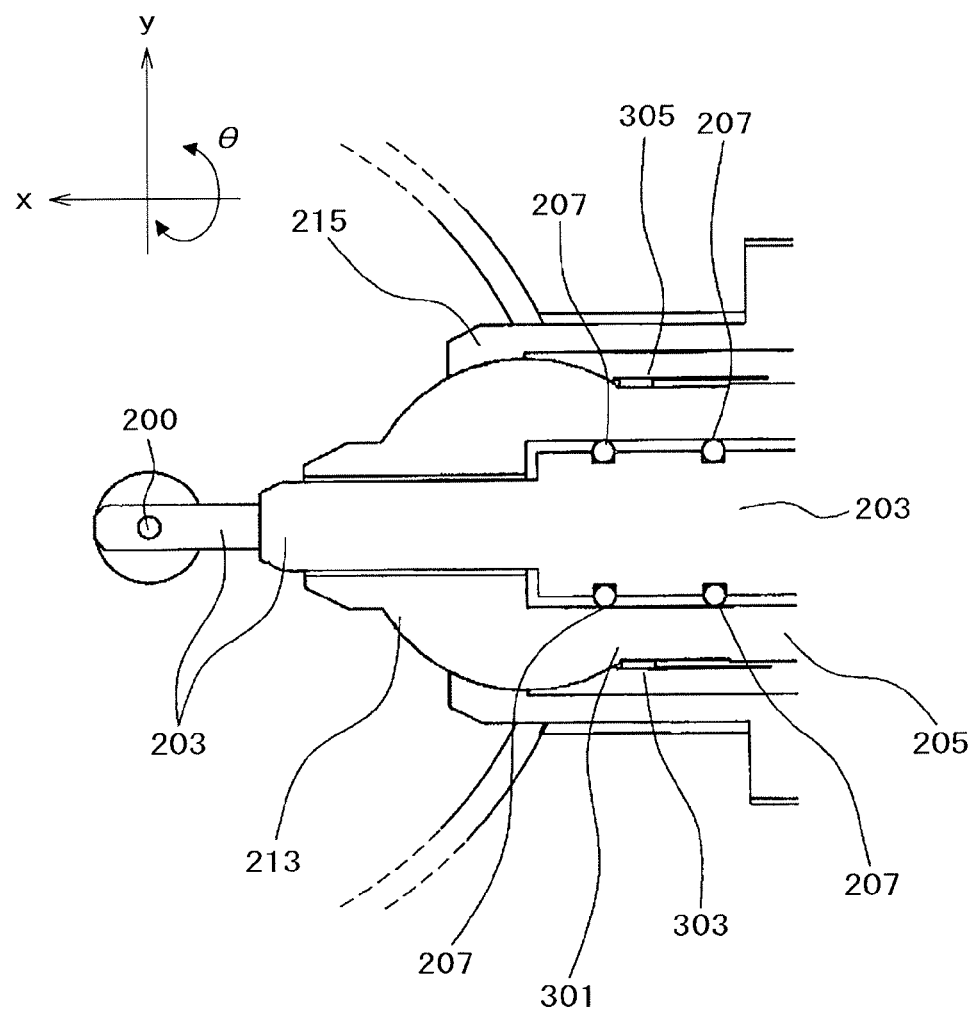
FIG. 3 is another sectional view of the sample micromotion mechanism of the charged particle device shown and described as the first embodiment of the present invention.

FIG. 3 shows a method of detecting deformation of the sliding cylinder 205 that occurs near the spherical fulcrum 213 for positioning the sample 200 in the y-direction. In the present invention, the deformation of the sliding cylinder 205 that causes a sample drift is detected by means of detecting strain that occurs in constituent members of the sample micromotion mechanism. When the sample holder 203 positions, for example, in the y-direction the sample 200 mounted at the distal end of the holder, the sample holder 203 moves by leverage with the sliding section as a pivot point, the sliding section including the spherical fulcrum 213 and spherical seat 215 located near a distal end of the sliding cylinder 205. During the leverage movement of the sample holder 203, friction against the sliding section, gravity that the spherical fulcrum 213 exerts upon the spherical seat 215, and a force that acts with the above friction to pull the spherical fulcrum 213 into an internal vacuum of the housing 123 generate a frictional force that impedes the movement of the sliding cylinder 205, thereby cause a bending moment, and consequently deform the sliding cylinder 205.

During the positioning of the sample 200 in the y-direction, the deformation of the sliding cylinder 205 becomes a maximum when the sliding cylinder 205 begins to move causing static friction to a sliding surface. When the sliding cylinder 205 is moving, the static friction changes into kinetic friction slightly smaller than the static frictional force, and when the sliding cylinder 205 comes to rest, the kinetic friction changes back into static friction, thus maximizing the deformation. At this time, repulsion of the sliding cylinder 205 due to the deformation is balanced with the bending moment caused by the static friction.

If external vibration is transmitted to the sliding section, although the static friction against the sliding section remains invariant, the gravity that the spherical fulcrum 213 exerts upon the spherical seat 215, or the force that pulls the spherical fulcrum 213 into the internal vacuum of the housing 123 may decrease with the vibration and correspondingly reduce the frictional force. If the frictional force is thus reduced, the repulsion that the sliding cylinder 205 develops will decrease to a level at which the repulsion becomes balanced with the frictional force, and the decrease will phase down the deformation of the sliding cylinder 205 and cause the sample drift.

The present invention features reducing the deformation of the sliding cylinder 205 for suppressed sample drift, with attention focused upon the fact that even after the static frictional force has decreased for a reason such as the external vibration, the sample drift does not occur if the repulsion of the sliding cylinder 205 due to the deformation is smaller than the frictional force.

If the static frictional force deforms the sliding cylinder 205, strain occurs as calculated from a rate of the deformation and an elastic modulus of the members subjected to the deformation. Accordingly the strain that has occurred in the sliding cylinder 205 is detected in the present invention.

Figure 4:
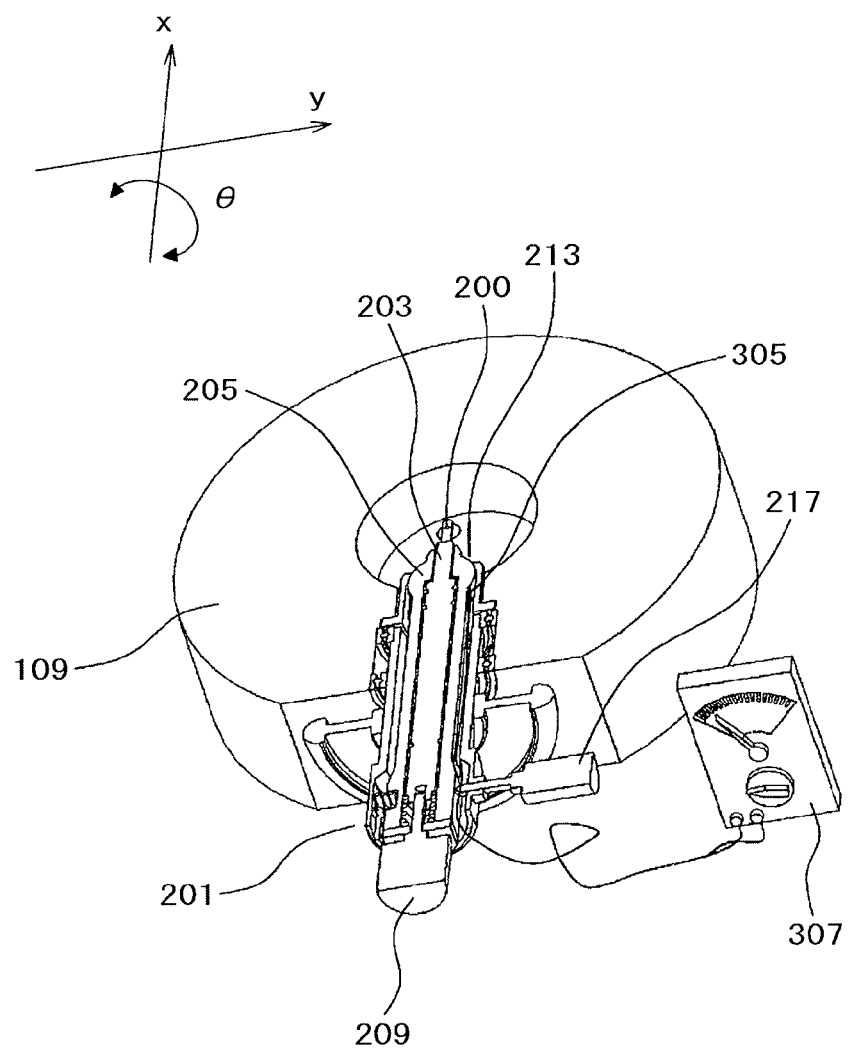
FIG. 4 is yet another sectional view of the sample micromotion mechanism of the charged particle device shown and described as the first embodiment of the present invention.

The bending moment, caused by the static frictional force that deforms the sliding cylinder 205, is maximized in a vicinity of a boundary 301 between a sliding surface of the spherical fulcrum 213 and a body surface of the sliding cylinder 205. Strain sensors 303 and 305 for detecting strain are placed in a corresponding section. FIG. 4 represents a method of using a metal resistance strain sensor as an element for detecting strain in the sliding cylinder 205.

While it is efficient to place the strain sensor at where the bending moment is maximized, the placement location for the strain sensor is not always limited to there. For strain detection in y- and z-directions, in particular, it is efficient to place the strain sensor at where the bending moment is maximized; while for strain detection in x-direction, any other suitable placement location may be selected.

The objective lens 109 and the sample micromotion mechanism 201 placed adjacently thereto are shown in sectional view in FIG. 4 for illustrative purposes. When the sample 200 is positioned in the y-direction, the micromotion screw 217 is operated to cause the sliding cylinder 205 to move by leverage with the spherical fulcrum 213 as its center. This leverage motion deforms the sliding cylinder 205 and generates strain proportional to the amount of deformation. After the sliding cylinder 205 has moved in the y-direction, a metal resistance strain sensor detects the strain as the strain sensor 305 placed in the vicinity of the boundary between the spherical fulcrum 213 and the body surface of the sliding cylinder 205, and sends the strain value to a resistance meter 307. The resistance meter 307 then detects and indicates a resistance value corresponding to the strain value.

The metal resistance strain sensor is placed on the body surface of the sliding cylinder 205 by, for example, bonding this sensor with an epoxy-based, phenol-epoxy-based, or cyanoacrylate-based adhesive, or any other suitable adhesive. For example, if the resistance value detected without strain on the metal resistance strain sensor is 120Ω and this resistance value changes to 120.00Ω after the movement of the sliding cylinder 205 in the y-direction, the change in the resistance value indicates that strain equivalent to a longitudinal deformation of 52 nm per 10 mm in a vicinity of the strain sensor 305 is occurring in the sliding cylinder 205. If the frictional force occurring between the spherical fulcrum 213 and the sliding surface of the spherical seat 215 by reason of external vibration or the like decreases and the deformation decreases by 10%, this means that the sample 200 drifts by 5 nm in the y-direction.

Accordingly, the micromotion screw 217 is operated to reduce the deformation of the sliding cylinder 205 so that the resistance value detected will be 120Ω, the resistance value detected without strain on the metal resistance strain sensor. Operating the micromotion screw 217 in this way will only reduce the deformation of the sliding cylinder 205 and will not move the sample 200 in the y-direction. When the micromotion screw 217 is operated so that the resistance meter 307 indicates a resistance value of 120.008Ω, strain equivalent to a longitudinal deformation of 42 nm per 10 mm in the vicinity of the strain sensor 305 will only be occurring and the sample drift due to external vibration or the like will not occur.

Although a conventional method of detecting deformation in terms of a change in distance needs a distance to be used as a reference, the method of detecting strain in accordance with the present invention does not need the reference distance affected by measurement accuracy. This feature allows deformation to be detected with high accuracy and hence the sample drift to be reduced accurately. In addition, since the reference distance is unnecessary, in a sample micromotion mechanism called the side-entry type enabling it to be reduced in size and usually requiring placement in such a form that the sample micromotion mechanism crosses a magnetic field generated by an objective lens, the objective lens can be easily placed in the sample micromotion mechanism reduced in size so as to reduce an area of the magnetic field which the objective lens will block for a narrower spatial distribution of the magnetic field relative to an enlarging scale factor.

Wheatstone Bridge Circuit

Figure 5:
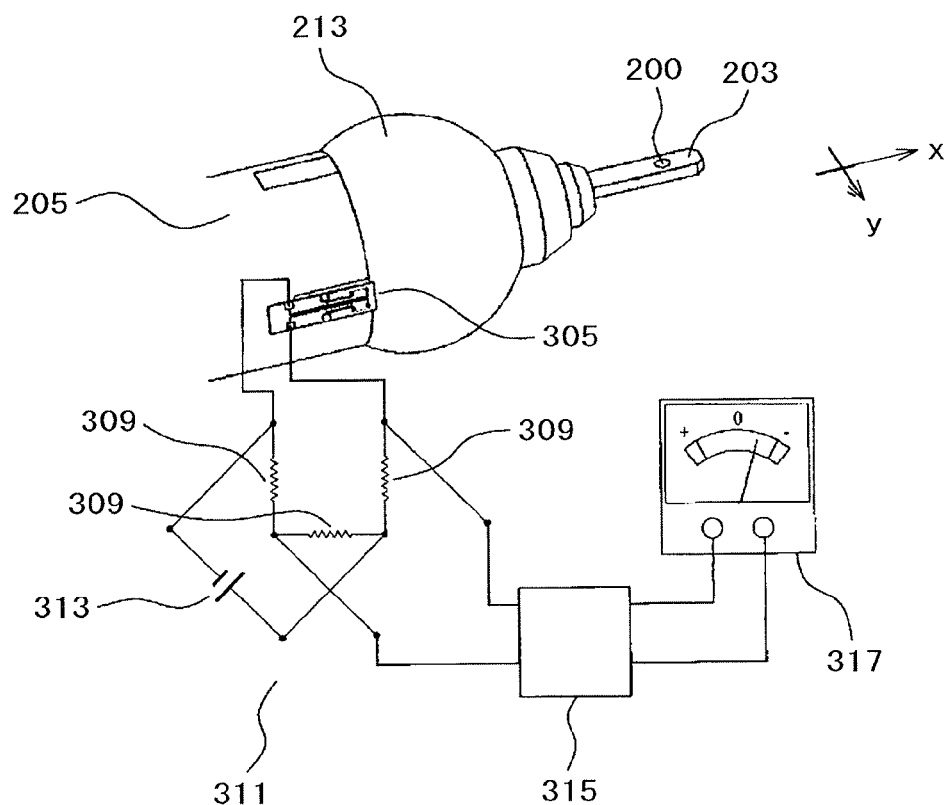
FIG. 5 is a further sectional view of the sample micromotion mechanism of the charged particle device shown and described as the first embodiment of the present invention.

FIG. 5 shows a method of detecting strain due to the deformation of the sliding cylinder 205 and representing the strain value detected. This method employs a Wheatstone bridge circuit and other elements. The Wheatstone bridge circuit 311, used instead of the resistance meter 307, is formed by combining three resistors, 309, each of which has the same value as a resistance value of a metal resistance strain sensor, or a strain sensor 305. The strain sensor 305 connects to the Wheatstone bridge circuit 311. A direct-current (DC) power supply 313 also connects to the Wheatstone bridge circuit 311.

The Wheatstone bridge circuit 311 has its output signal value represented as a signal level indication on a signal level indicator 317 via a signal amplifier 315. When the sliding cylinder 205 suffers no deformation, the values of the resistors which constitute the Wheatstone bridge circuit 311 including the metal resistance strain sensor, or the strain sensor 305, all become the same and the signal level indicator 317 indicates zero.

With the Wheatstone bridge circuit 311, even if the DC power supply as a reference voltage device which applies a voltage to the Wheatstone bridge circuit 311, and the signal amplifier as a differential amplifier which amplifies the output signal from the Wheatstone bridge circuit 311 become unstable, the output from the differential amplifier is held at zero when strain is absent.

When the sliding cylinder 205 suffers deformation, the resistance value of the metal resistance strain sensor which is the strain sensor 305 differs from the values of the resistors constituting the Wheatstone bridge circuit 311. In this case, the signal level indicator 317 indicates a deviation corresponding to the deformation. Accordingly the micromotion screw 217 (see FIG. 4) is operated to obtain a zero deviation indication on the signal level indicator 317. This reduces the deformation of the sliding cylinder 205, thus enabling the occurrence of any sample drift, caused by external vibration or the like, to be suppressed.

Using the Wheatstone bridge circuit 311 to detect the resistance value of the metal resistance strain sensor which is the strain sensor 305, therefore, allows presence/absence of strain to be detected sensitively and hence any sample drift to be minimized.

Figure 6:
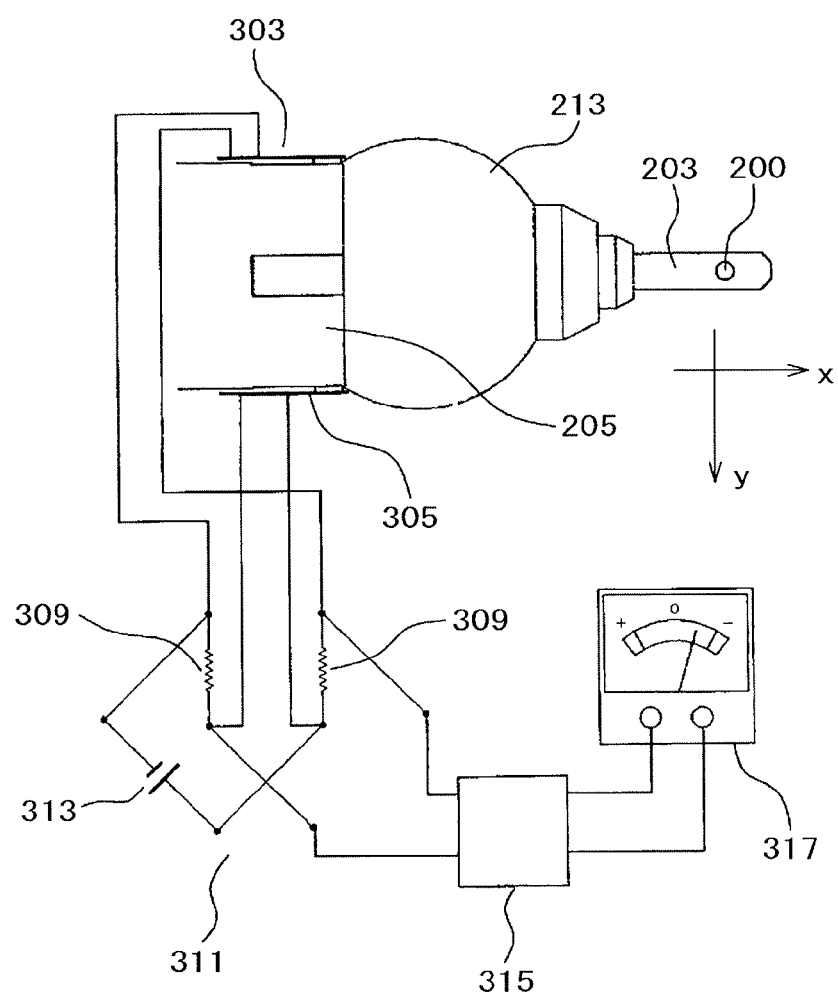
FIG. 6 is a further sectional view of the sample micromotion mechanism of the charged particle device shown and described as the first embodiment of the present invention.

FIG. 6 shows another method of detecting strain due to the deformation of the sliding cylinder 205 and representing the strain value detected.

The strain in the sliding cylinder 205 due to the deformation caused thereto when the sample 200 is positioned in a positive y-direction is detected using a Wheatstone bridge circuit 311 formed by combining three kinds of elements: a metal resistance strain sensor as a strain sensor 305, which detects deformation of the strain sensor itself in the same direction as that at which the sensor elongates; a metal resistance strain sensor as a strain sensor 303, which detects deformation of the strain sensor itself in the same direction as that at which the sensor contracts; and two resistors, 309, having the same resistance values as those of the above two strain sensors.

This detection method uses the two metal resistance strain sensors placed at different positions. This method, therefore, generates an output of the Wheatstone bridge circuit 311 that is twice as large as in the detection method described per FIG. 5, so that the presence/absence of strain can be detected more sensitively and thus any sample drift can be minimized.

Figure 7:
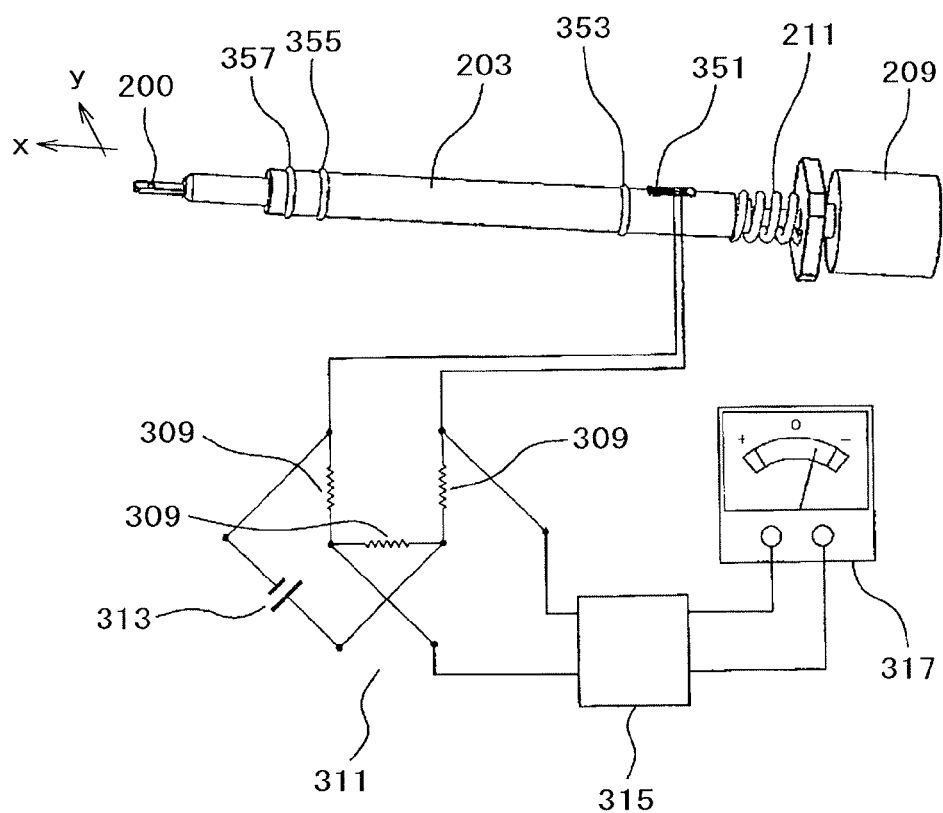
FIG. 7 is an outline diagram of strain detection in a sample holder shown in the first embodiment of the present invention.

FIG. 7 shows a method of detecting deformation of a sample holder 203 when a sample 200 is positioned in a positive x-direction, and then reducing the deformation so as to reduce a drift of the sample. For ease in description, a sliding cylinder 205 internally holding the sample holder 203 is omitted from the figure.

When the sample holder 203 is positioned in the x-direction by actions of a micromotion screw 209 and a spring 211, O-rings 207 arranged between the sliding cylinder 205 and the sample holder 203 so as to maintain the internal vacuum of the housing 123 slide while suffering deformation.

A repulsive force of the O-rings 207 due to the deformation of their own is exerted upon the sample holder 203, and thus the sample holder 203 also deforms. Since the deformation of the O-rings 207 progressively decreases with external vibration and the like, the resulting repulsion of the O-rings 207 also decreases, which in turn reduces the deformation of the sample holder 203 and generates a sample drift in the x-direction. The deformation of the sample holder 203 becomes a maximum between the spring 211 exerting a force upon the sample holder 203, and an O-ring 353, the O-ring that is closest to the spring 211, of all O-rings that generate repulsion of the spring 211.

For this reason, a strain sensor 351 is placed at where the deformation of the sample holder 203 is maximized, and the deformation of the sample holder 203 is detected there.

A Wheatstone bridge circuit 311 is formed by combining three resistors, 309, each of which has the same value as a resistance value of a metal resistance strain sensor, or a strain sensor 351. The strain sensor 351 connects to the Wheatstone bridge circuit 311. A direct-current (DC) power supply 313 also connects to the Wheatstone bridge circuit 311. The Wheatstone bridge circuit 311 has its output signal value represented as a signal level indication on a signal level indicator 317 via a signal amplifier 315. The signal level indicator 317 indicates zero when the sliding cylinder 205 suffers no deformation, that is, under the state where values of the resistors which constitute the Wheatstone bridge circuit 311 including the metal resistance strain sensor, or the strain sensor 351, all become the same. When the sample holder 203 suffers deformation and the resistance value of the metal resistance strain sensor which is the strain sensor 351 differs from the values of the resistors constituting the Wheatstone bridge circuit 311, the signal level indicator 317 indicates a deviation corresponding to the deformation. Accordingly the micromotion screw 209 is operated to obtain a zero deviation indication on the signal level indicator 317. This reduces the deformation of the sample holder 203, thus enabling the occurrence of any sample drift, caused by external vibration or the like, to be suppressed. Using the Wheatstone bridge circuit 311 to detect the resistance value of the metal resistance strain sensor which is the strain sensor 351, therefore, allows the presence/absence of strain to be detected sensitively and hence any sample drift to be minimized.

Because the strain caused by the deformation of the sample micromotion mechanism 201 is smaller than one microstrain, use of a semiconductor resistance strain sensor more accurate than metal resistance strain sensors allows the deformation of the micromotion mechanism 201 to be reduced by detecting very small strain, thereby suppressing a drift of the sample.

Semiconductor Resistance Strain Sensor

Figure 8:
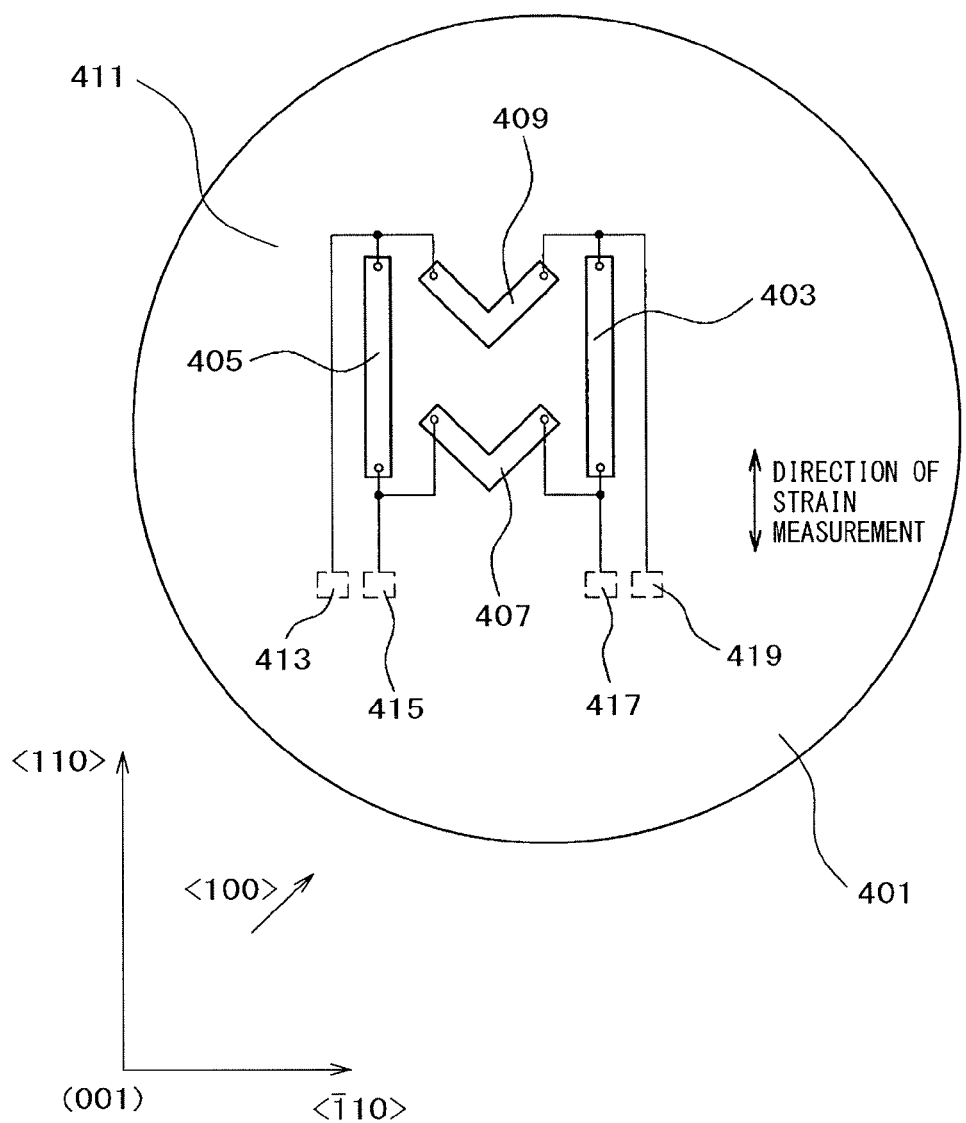
FIG. 8 is a diagram showing an example of a semiconductor resistance strain sensor for detecting strain.

FIG. 8 shows an example of using a semiconductor resistance strain sensor to detect strain. This semiconductor resistance strain sensor replaces one of the strain sensors shown as 303, 305, and 351 in FIGS. 3, 4, 5, and 6. Two resistance strain sensors that detect strain, and two resistors that exhibit the same resistance values as those of the resistance strain sensors are used to form a Wheatstone bridge circuit on one single-crystal silicon substrate. The Wheatstone bridge circuit operates as the semiconductor resistance strain sensor.

The strain sensor elements and resistors needed for the Wheatstone bridge circuit to detect strain are all arranged on one single-crystal silicon substrate. Hence, this circuit has a feature that since changes in ambient temperature give a uniform influence to the circuit, the strain value detected will be practically insusceptible to the changes in ambient temperature.

A change rate of resistance and that of elongation/contraction are represented as follows by expression (1):

$$\Delta R/R = (1+2\sigma)\Delta L/L \tag{1}$$

(where R: resistance value, $\Delta R$: change in resistance value, L: length of the strain sensor, $\Delta L$: change in the length of the strain sensor, and $\sigma$: Poisson's ratio of the material.)

For a metallic material, $\sigma$ is about 0.3, so it follows that the change rate of resistance is 1.6 times that of elongation/contraction.

A change in resistance value due to the elongation/contraction of the semiconductor material is represented as follows by expression (2):

$$\Delta R/R = (\pi E + 1 + 2\sigma)\Delta L/L \tag{2}$$

(where $\pi$: piezoresistance coefficient of the material, and E: elastic modulus of the material.)

If the semiconductor material is a silicon semiconductor, forming a conductor by diffusing a p-type impurity over a plane of crystal orientation (100) of the material gives a piezoresistance coefficient of $72 \times 10^{-11}$ Pa$^{-1}$ and an elastic modulus of $185 \times 10^9$ Pa of the silicon, so the change rate of resistance becomes 133 times that of elongation/contraction.

Hence, sensitivity increases above that of the strain sensor which detects the change in resistance value due to the elongation/contraction of the metallic material.

A number denoted by three numerals in parentheses in FIG. 8 signifies a Miller index, and numbers each denoted by three numerals in angle brackets in the figure signify orientations in terms of vectors, with the first digit denoting a component of the x-direction, the second digit denoting a component of the y-direction, and the third digit denoting a component of the z-direction, and with a negative directional component being expressed with a bar above the numeral.

The single-crystal silicon substrate 401 in FIG. 8 has a crystal plane expressed by miller index (001). A rectangle with length in direction <110> is patterned on the substrate 401 and then p-type impurities are selectively diffused over the rectangle to form resistance strain sensors 403 and 405. In addition, a V-shaped region with length in direction <100> is patterned on the substrate 401 and then p-type impurities are selectively diffused over the region to form V-shaped resistors 407 and 409. The resistance strain sensors 403 and 405 and the V-shaped resistors 407 and 409 are further combined to form a Wheatstone bridge circuit that operates as the semiconductor resistance strain sensor.

In this method, forming the strain sensor, on which the region obtained by diffusing the p-type impurity in the silicon substrate is elongated in direction <110>, provides an effect in that sensitivity can be made even higher by further increasing the region in length. Additionally, forming the resistors into a V-shape at the region obtained by diffusing p-type impurity layers in the substrate, and in such a form that a linear section forming the V-shape has length in direction <100>, provides effects in that no strain detection error is caused by changes in atmospheric pressure that are exerted upon the sample micromotion mechanism, and thus in that a detection error due to deformation whose direction is orthogonal to that of the deformation of the sample micromotion mechanism can be suppressed. Furthermore, using the same p-type impurity layer to construct the resistance strain sensors and the resistors provides an effect in that since respective resistance values and temperature dependence of these resistance values can be controlled to substantially the same value between the resistance strain sensors and the resistors, no strain detection error is caused by changes in a temperature of the sample micromotion mechanism.

Since the Wheatstone bridge circuit 411 is formed on one silicon substrate, 401, connecting a DC power supply between terminals 413 and 417 causes the resistance values of the resistance strain sensors 403 and 405 to change in response to the deformation of the sample micromotion mechanism 201, and develops an output of a voltage corresponding to the deformation of the sample micromotion mechanism 201. This output then has its value indicated on the signal level indicator 317 (see FIG. 6 or 7) via the signal amplifier 315 (also see FIG. 6 or 7). Accordingly the micromotion screw 209 or 217 (see FIG. 4) is operated to obtain a zero deviation indication on the signal level indicator 317. This reduces the deformation of the sample micromotion mechanism 201, thus enabling the occurrence of any sample drift, caused by external vibration or the like, to be suppressed.

Figure 9:
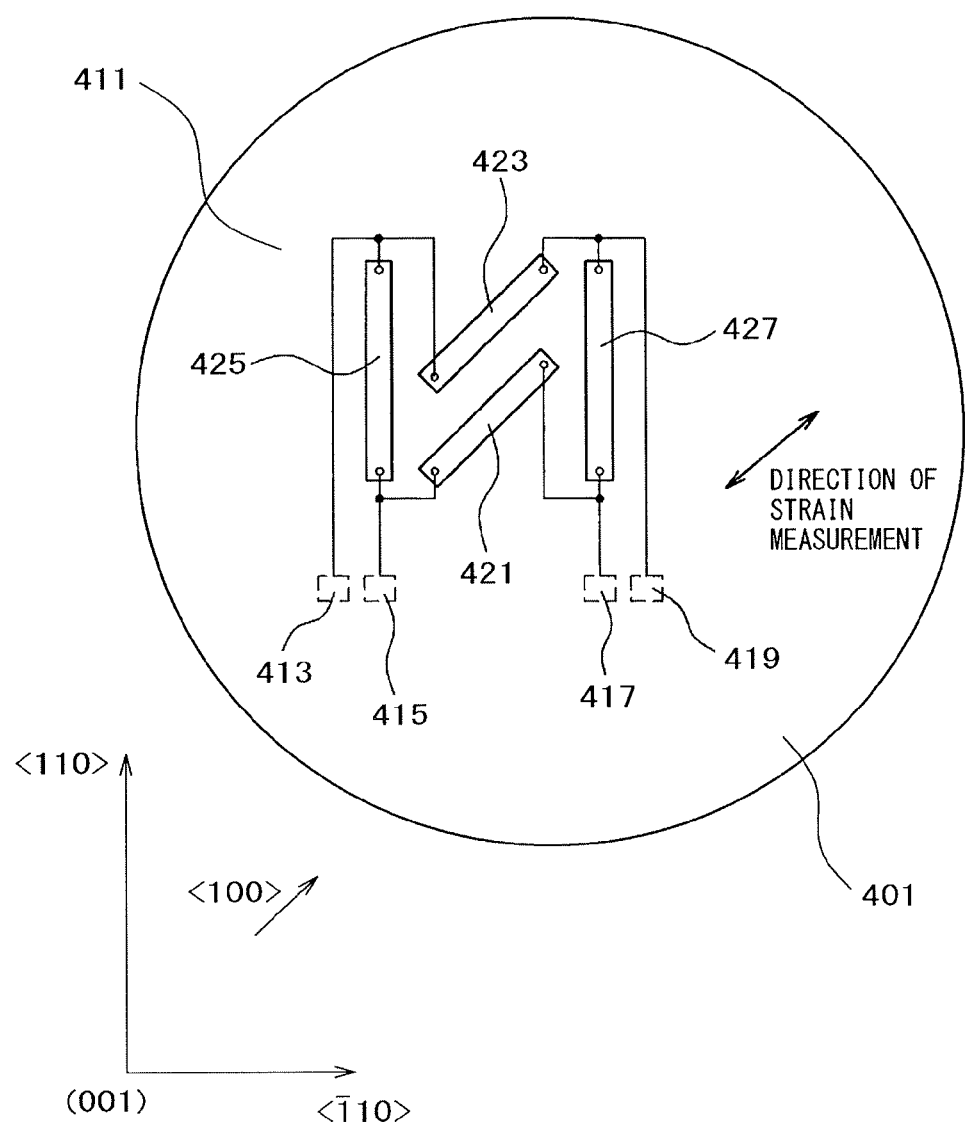
FIG. 9 is a diagram showing another example of a semiconductor resistance strain sensor for detecting strain.

FIG. 9 shows another example of a semiconductor resistance strain sensor for detecting strain. Two resistance strain sensors, 421 and 423, that detect strain, and two resistors, 425 and 427, that exhibit the same values as those of the resistance strain sensors are constructed on a single-crystal silicon substrate 401 to form a Wheatstone bridge circuit that operates as the semiconductor resistance strain sensor.

The resistance strain sensors 421 and 423 are formed by patterning a rectangle with length in direction <110> on a crystal plane expressed by Miller index (001), and then selectively diffusing n-type impurities over the rectangle. The resistors 425 and 427 are likewise formed by patterning a rectangle with length in direction <110> and then selectively diffusing n-type impurities over the rectangle. The resistance strain sensors 421 and 423 and the resistors 425 and 427 are further combined to form the Wheatstone bridge circuit that operates as the semiconductor resistance strain sensor.

In this method, since the Wheatstone bridge circuit 411 is likewise formed on one silicon substrate, 401, connecting a DC power supply between terminals 413 and 417 causes resistance values of the resistance strain sensors 423 and 425 to change in response to the deformation of the sample micromotion mechanism 201, and causes a voltage commensurate with the deformation of the sample micromotion mechanism 201 to be output between terminals 415 and 419. This output then has its value indicated on the signal level indicator 317 (see FIG. 6 or 7) via the signal amplifier 315 (also see FIG. 6 or 7). Accordingly the micromotion screw 209 or 217 (see FIG. 4) is operated to obtain a zero deviation indication on the signal level indicator 317. This reduces the deformation of the sample micromotion mechanism 201, thus enabling the occurrence of any sample drift, caused by external vibration or the like, to be suppressed.

Figure 10:
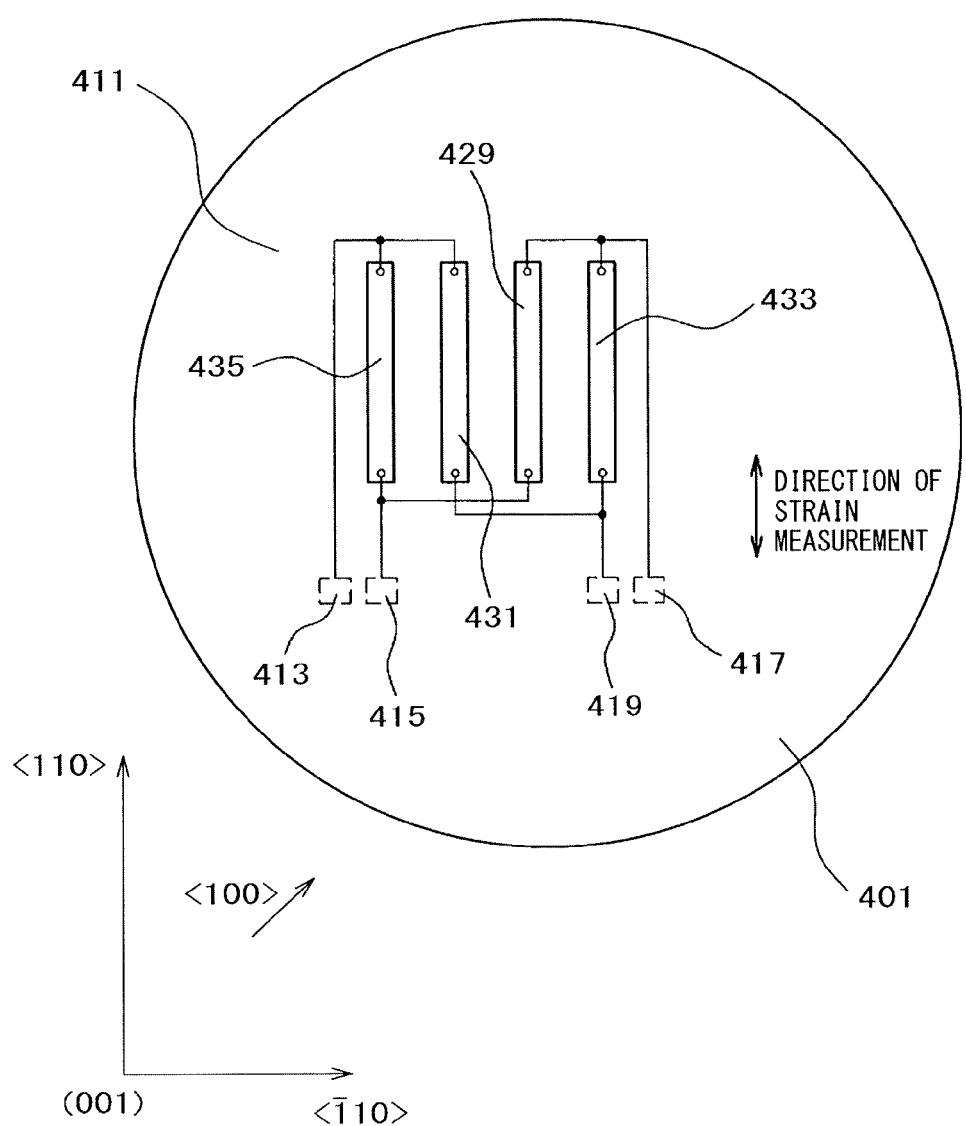
FIG. 10 is a diagram showing yet another example of a semiconductor resistance strain sensor for detecting strain.

FIG. 10 shows yet another example of a semiconductor resistance strain sensor for detecting strain. Two resistance strain sensors, 429 and 431, that detect strain, and two resistors, 433 and 435, that exhibit the same values as those of the resistance strain sensors are constructed on a single-crystal silicon substrate 401 to form a Wheatstone bridge circuit that operates as the semiconductor resistance strain sensor.

The resistance strain sensors 429 and 431 are formed by patterning a rectangle with length in direction <110> on a crystal plane expressed by Miller index (001), and then selectively diffusing p-type impurities over the rectangle. The resistors 433 and 435 are likewise formed by patterning a rectangle with length in direction <110> and then selectively diffusing n-type impurities over the rectangle. The resistance strain sensors 429 and 431 and the resistors 433 and 435 are further combined to form the Wheatstone bridge circuit that operates as the semiconductor resistance strain sensor.

This method features high sensitivity since whereas the p-type impurity diffusion layer exhibits a change in resistance of a positive value in response to a change in positive strain in a strain measuring direction, the n-type impurity diffusion layer exhibits a change in resistance of a negative value in response to the change in the positive strain in the strain measuring direction.

In this method, since the Wheatstone bridge circuit 411 is likewise formed on one silicon substrate, 401, connecting a DC power supply between terminals 413 and 417 causes resistance values of the resistance strain sensors 429 and 431 to change in response to the deformation of the sample micromotion mechanism 201, and causes a voltage commensurate with the deformation of the sample micromotion mechanism 201 to be output between terminals 415 and 419.

This output then has its value indicated on the signal level indicator 317 (see FIG. 6 or 7) via the signal amplifier 315 (also see FIG. 6 or 7). Accordingly the micromotion screw 209 or 217 (see FIG. 4) is operated to obtain a zero deviation indication on the signal level indicator 317. This reduces the deformation of the sample micromotion mechanism 201, thus enabling the occurrence of any sample drift, caused by external vibration or the like, to be suppressed.

Sample Drift Adjusting Sequence

Figure 11:
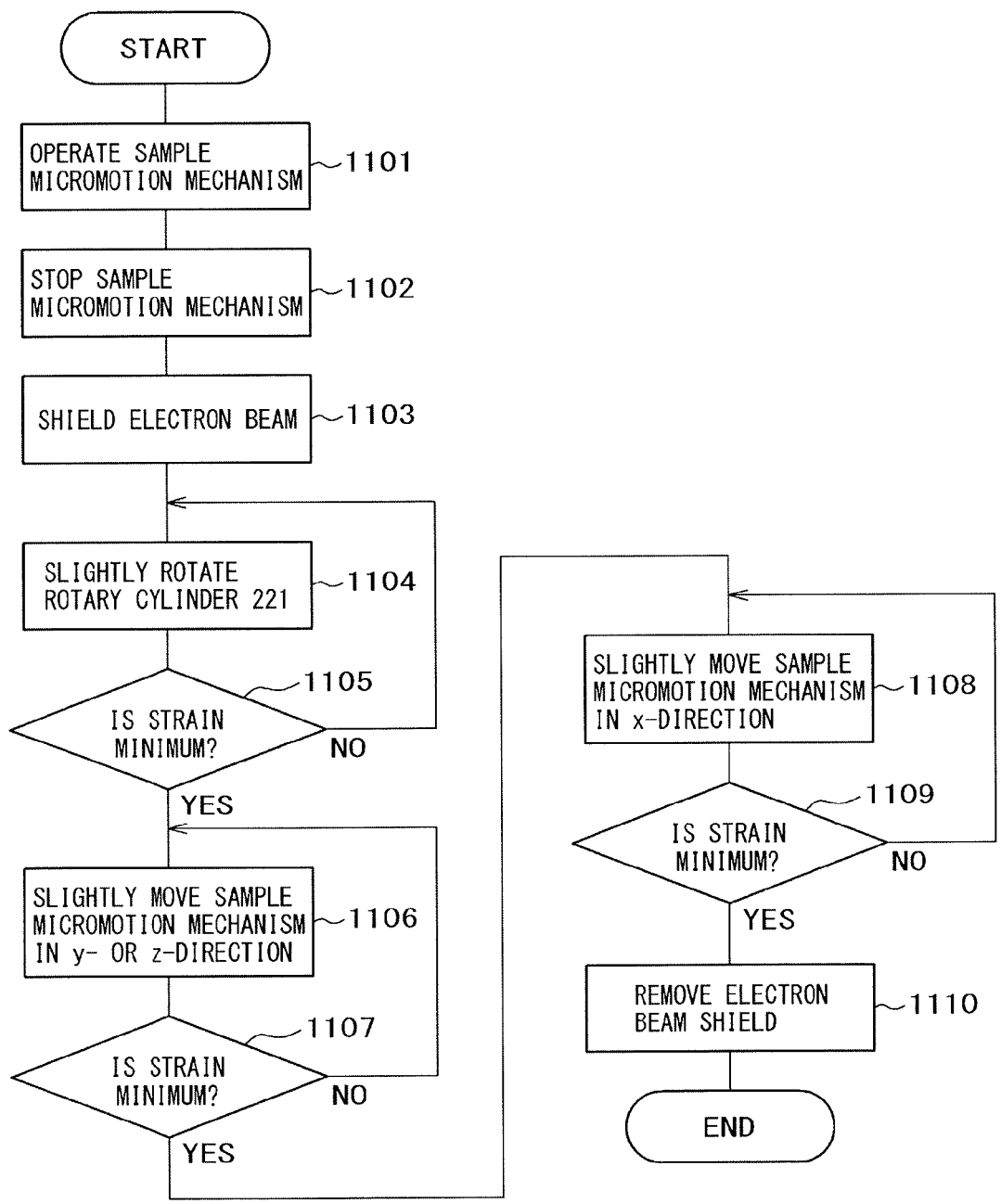
FIG. 11 is a flowchart that shows operation of a charged particle device according to the present invention.

FIG. 11 is a flowchart that describes a sequence for detecting strain in the sample micromotion mechanism 201 so as to suppress the sample drift described per FIGS. 1 to 10, and then reducing deformation of the sample micromotion mechanism 201 by conducting a micromotion adjustment upon the sample micromotion mechanism 201 according to the detected strain. This sequence includes:

(1) Executing "OPERATE SAMPLE MICROMOTION MECHANISM" (step 1101) to select a position at which a sample is to be irradiated with an electron beam;

(2) Executing "STOP SAMPLE MICROMOTION MECHANISM" (step 1102) to stop the sample micromotion mechanism after the selection of the irradiating position;

(3) After step 1102, executing "SHIELD ELECTRON BEAM" (step 1103) by closing the aperture 105 to intercept the electron beam midway so as to prevent radiation from causing the strain sensor to generate noise when the electron beam hits a part of the sample or housing and generates the radiation;

(4) After step 1103, executing "SLIGHTLY ROTATE ROTARY CYLINDER 221" (step 1104) by operating a rotating handle 223 so as to rotate the rotary cylinder 221 of the sample micromotion mechanism 201 to a rotating position at which the that minimum deformation of the sliding cylinder 205 corresponds to a minimum strain, the execution of step 1104 being thus beneficial for removing any twist and strain caused to the sliding cylinder 205 by the rotation of the rotary cylinder 221, and reducing a magnitude of a strain detection error due to the deformation of the sliding cylinder 205;

(5) Determining whether the strain in the sliding cylinder 205 due to the deformation is the minimum (step 1105); if the determination results in 'yes' (affirmative), control proceeds to step 1106, and if the determination results in 'no' (negative), control is returned to step 1104;

(6) After one of steps 1104, 1105, and 1006, slightly moving the sliding cylinder 205 of the sample micromotion mechanism 201 in the y- or z-direction to the position at which the minimum deformation of the sliding cylinder 205 corresponds to the minimum strain (step 1106);

(7) Determining whether the strain in the sliding cylinder 205 due to the deformation is the minimum (step 1107); if the determination results in 'yes' (affirmative), control proceeds to step 1109, and if the determination results in 'no' (negative), control is returned to step 1106;

(8) After one of steps 1106, 1107, and 1109, slightly moving the sample holder 203 of the sample micromotion mechanism 201 in the x-direction to a position at which the that minimum deformation of the sample holder 203 corresponds to a minimum strain (step 1108);

(9) Determining whether the strain in the sliding cylinder 205 due to the deformation is the minimum (step 1109); if the determination results in 'yes' (affirmative), control proceeds to step 1110, and if the determination results in 'no' (negative), control is returned to step 1108; and

(10) Finally, opening the aperture 105 to execute "REMOVE ELECTRON BEAM SHIELD" (step 1110).

In accordance with the above sequence, strain is detected in the direction that the entire micromotion mechanism rotates. Next after the sample micromotion mechanism has been slightly moved in the rotating direction according to the detected strain value, the sample micromotion mechanism is slightly moved in a twisting direction according to a strain value detected in the direction that the entire micromotion mechanism twists and deforms. In the sample-positioning structure constituting the sample micromotion mechanism 201, deformation of a larger member disposed on the outside is reduced first and then that of a member disposed internally to the larger member is reduced, so that the deformation of the sample micromotion mechanism 201 can be reduced without repetitive adjustment. This makes it possible to suppress the occurrence of the sample drift.

In addition, the strain value that has been detected in the rotating direction is increased to, for example, 10 times an initial value, the strain value that has been detected in the twisting direction is held intact, after respective absolute values have been calculated a value obtained by adding all the calculated values is presented. According to the presented value, the sample micromotion mechanism is slightly moved in automatic operation mode in both the rotating direction and the twisting direction. Thus the strain in the rotating direction of the sample micromotion mechanism can be reduced with priority over the strain in the twisting direction, and this enables the deformation of the sample micromotion mechanism to be reduced accordingly. This makes it possible to reduce the sample drift accurately.

Second Embodiment

A configuration as well as functions and advantageous effects of a second embodiment of the present invention are described below referring to FIGS. 12 to 15.

The present embodiment presents an example of suppressing a sample drift under automatic control. The first embodiment employs micromotion screws to adjust the sample drift, whereas the second embodiment employs micromotion motors instead of the micromotion screws. The micromotion motor has its operation controlled by signals transmitted from a control unit not shown.

The following describes details of the control.

Figure 12:
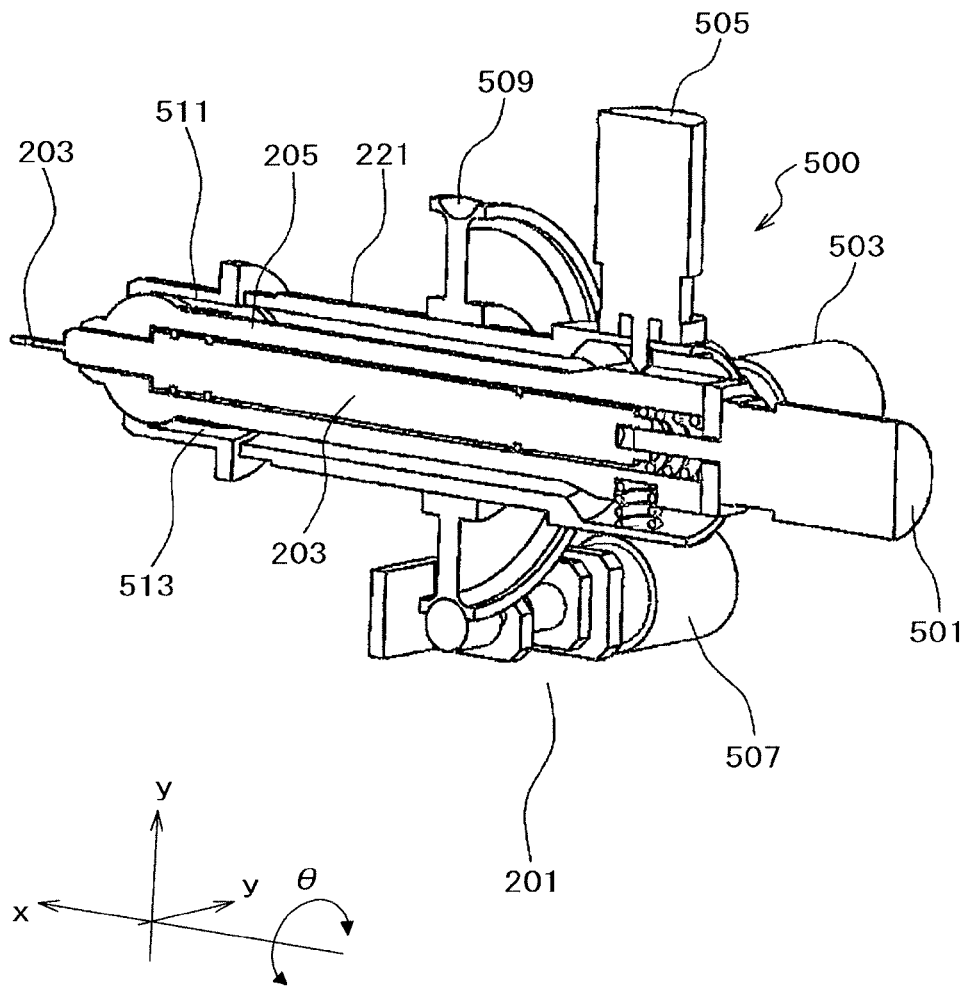
FIG. 12 is a cross-sectional view of a sample micromotion mechanism of a charged particle device shown and described as a second embodiment of the present invention.

FIG. 12 shows a sample micromotion mechanism 500 in sectional view for illustrative purposes. A micromotion motor 501 moves a sample holder 203 in an x-direction. A micromotion motor 503 moves a sliding cylinder 205 in a y-direction. A micromotion motor 505 moves the sliding cylinder 205 in a z-direction. A micromotion motor 507 rotates a gear 509 in a theta (θ) direction, the gear 509 being placed on a rotary cylinder 221 as shown. The sample holder 203 includes a strain sensor 351 (see FIG. 7) that detects strain due to deformation in the x-direction, the sliding cylinder 205 includes a strain sensor 303 or 305 (see FIG. 6) that detects strain due to deformation in the y-direction, and the sliding cylinder 205 includes a strain sensor 511 or 513 that detects strain due to deformation in the z-direction.

Figure 13:
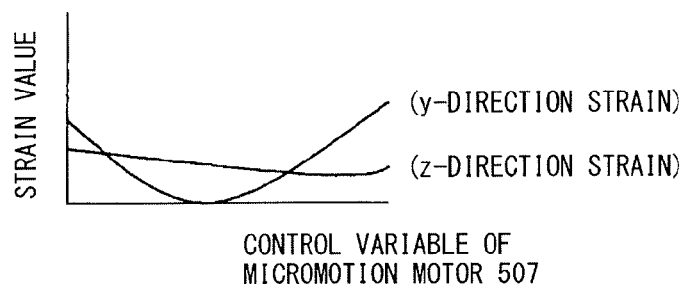
FIG. 13 is a diagram representing one example of a relationship between changes in a controlled variable of a motor shown and described in the second embodiment of the present invention, and changes in strain data detected for the controlled variable.

First while making the micromotion motor 507 operate to rotate the rotary cylinder 221 in a direction opposite to a direction in which the rotary cylinder last rotated, the sample micromotion mechanism 500 records any changes in y-direction and z-direction strain values, detected with respect to the deformation of the sliding cylinder 205. For example, such results as shown in FIG. 13 are obtained from recorded data. Referring to FIG. 13, changes in strain values (arbitrary scales) are plotted on a vertical axis and changes in a control variable (angle of rotation in the θ-direction) of the micromotion motor 507 are plotted on a horizontal axis, with its left end denoting a rotational angle of zero degrees and with the rotational angle increasing as it goes rightward.

Figure 14:
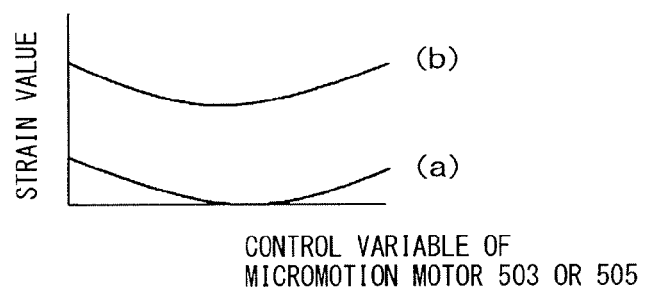
FIG. 14 is a diagram representing another example of a relationship between changes in a controlled variable of a motor shown and described in the second embodiment of the present invention, and changes in strain data detected for the controlled variable.

Next while making the micromotion motor 503 operate to move the sliding cylinder 205 in a direction opposite to the y-direction in which the sliding cylinder last moved, the sample micromotion mechanism 500 records any changes in y-direction strain value, detected with respect to the deformation of the sliding cylinder 205. For example, such a result as indicated by curve (a) in FIG. 14 is obtained from recorded data. Referring to FIG. 14, changes in strain value (arbitrary scale) are plotted on a vertical axis and changes in a control variable (amount of movement in the y- or z-direction) of the micromotion motor 503 or 505 are plotted on a horizontal axis, with its left end denoting a zero amount of movement and with the amount of movement increasing as it goes rightward.

Next while making the micromotion motor 505 operate to move the sliding cylinder 205 in a direction opposite to the z-direction in which the sliding cylinder last moved, the sample micromotion mechanism 500 records any changes in z-direction strain value, detected with respect to the deformation of the sliding cylinder 205. For example, such a result as indicated by curve (b) in FIG. 14 is obtained from recorded data.

Figure 15:
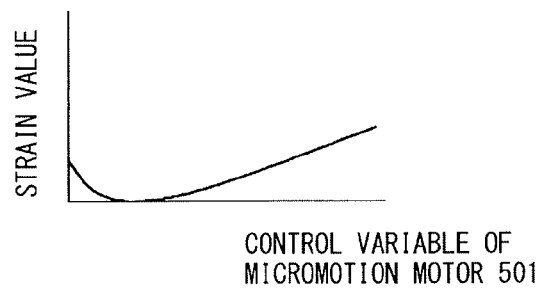
FIG. 15 is a diagram representing yet another example of a relationship between changes in a controlled variable of a motor shown and described in the second embodiment of the present invention, and changes in strain data detected for the controlled variable.

Furthermore, while making the micromotion motor 501 operate to move the sample holder 203 in a direction opposite to the x-direction in which the sample holder last moved, the sample micromotion mechanism 500 records any changes in x-direction strain value, detected with respect to the deformation of the sample holder 203. For example, such a result as shown in FIG. 15 is obtained from recorded data. Referring to FIG. 15, changes in strain value (arbitrary scale) are plotted on a vertical axis and changes in a control variable (amount of movement in the x-direction) of the micromotion motor 501 are plotted on a horizontal axis, with its left end denoting a zero amount of movement and with the amount of movement increasing as it goes rightward.

Furthermore, the sample micromotion mechanism 500 calculates a mean square of (z-direction strain) and (y-direction strain) from the results shown in FIG. 13, and without moving the rotary cylinder 221, drives the micromotion motor 507 to the position corresponding to the control variable for the micromotion motor 507 that minimizes the mean square as per the least squares method.

Furthermore, in accordance with the results shown in FIG. 14, without moving the sliding cylinder 205, the sample micromotion mechanism 500 drives the micromotion motors 503 and 505 to the positions corresponding to the control variables for the micromotion motors 503 and 505 that minimize respective absolute values of curves (a) and (b).

Furthermore, in accordance with the result shown in FIG. 15, without moving the sample holder 203, the sample micromotion mechanism 500 drives the micromotion motor 501 to the position corresponding to the control variable for the micromotion motor 501 that minimizes an absolute value of the strain in the sample holder 203.

The flowchart shown in FIG. 11 is programmed and saved as the above drift-adjusting sequence in an internal storage section of the control unit. In this automated drift-adjusting sequence, initial data and measured data are also saved in the storage section (not shown).

In this scheme, operations for minimizing the deformation of the sample micromotion mechanism 500 are not performed through a manual trial-and-error process. Instead, they can be automated. This makes it unnecessary for an operator to perform an operation for suppressing the sample drift, and enables the operator to observe the sample efficiently after sample positioning has been completed by the sample micromotion mechanism 500.

If the above sequence for minimizing the deformation of the sample micromotion mechanism 500 is repeated twice, a force that deforms the sample micromotion mechanism 500 can be exchanged at minimum load between the rotary cylinder 221, the sliding cylinder 205, and the sample holder 203, and the sample micromotion mechanism 500 having further less deformation can therefore be provided.

What is claimed is:

1. A charged particle device, comprising:
   a charged particle beam source for generating a charged particle beam;
   a charged particle optical system for controlling a path for the charged particle beam to propagate;
   a sample micromotion mechanism containing a sample holder to support a sample irradiated with the charged particle beam, the mechanism being configured to impart micromotion to the sample holder and position the sample; and
   a sensor unit for detecting the charged particle beam transmitted through the sample, wherein:
   the sample micromotion mechanism further includes a strain measuring unit to measure strain in a constituent member of the sample micromotion mechanism; and
   after positioning the sample, the sample micromotion mechanism imparts micromotion to the sample holder so as to counteract an amount of the strain in accordance with the amount of strain measured by the strain measuring unit.

2. The charged particle device according to claim 1, wherein:
   the sample micromotion mechanism further includes
   a sliding cylinder containing the sample holder, and
   a micromotion imparting unit for imparting micromotion to a distal end of the sample holder;
   the sample holder includes a portion that serves as a fulcrum for leverage motion of the sample holder, the micromotion imparting unit imparting micromotion to an end of the sample holder so as to slightly move an distal end of the sample holder; and
   the strain measuring unit is placed on a lateral surface of the sample holder that neighbors a sliding section at which the sliding cylinder and the fulcrum abut upon each other.

3. The charged particle device according to claim 1, wherein the sample micromotion mechanism is further configured to:
   include a Wheatstone bridge circuit including, as constituent elements thereof, the strain measuring unit and a resistor with a known resistance value, and
   counteract the amount of strain in accordance with an output of the Wheatstone bridge circuit.

4. The charged particle device according to claim 1, wherein:
   the strain measuring unit includes a Wheatstone bridge circuit constituted at least by a pair of resistors and a pair of resistance strain sensors, both of the pairs being formed on a semiconductor substrate.

5. The charged particle device according to claim 4, wherein:
   the pair of resistors and the pair of resistance strain sensors are formed on a semiconductor substrate including a (001) crystal plane;
   on each of the pair of resistance strain sensors, a rectangular pattern with length in a <110> crystal orientation confronts an equivalent rectangular pattern of the other, with an impurity being diffused over each of the patterns;
   on each of the pair of resistors, different rectangular patterns are formed in parallel, with an impurity being diffused over each of the patterns; and
   each of the pair of resistors is disposed next to each of the pair of resistance strain sensors in such a form as to be interposed between the sensors.

6. The charged particle device according to claim 4, wherein:
   the pair of resistors and the pair of resistance strain sensors are formed on a semiconductor substrate including a (001) crystal plane;
   on each of the pair of resistors, a rectangular pattern with length in a <110> crystal orientation confronts an equivalent rectangular pattern of the other, with an impurity being diffused over each of the patterns; and
   on each of the pair of resistance strain sensors, different rectangular patterns each with an impurity being diffused over the pattern are formed in parallel, and each of the pair of resistance strain sensors is disposed next to each of the pair of resistors in such a form as to be interposed between the resistors.

7. The charged particle device according to claim 1, further comprising the strain measuring unit in plurality, wherein:
   the sample holder slightly moves according to at least one of a mean square of strain quantities measured and acquired by the plurality of strain measuring units, and an absolute value of the strain quantities.

8. A sample micromotion mechanism, comprising:
   a sample holder for supporting a sample observed through a charged particle device;
   a sliding cylinder accommodating the sample holder;
   a micromotion mechanism for imparting a micromotion to a distal end portion of the sample holder supporting the sample; and
   a strain measuring unit disposed to measure strain occurring between the sliding cylinder and the micromotion mechanism.

9. The sample micromotion mechanism according to claim 8, wherein:
   the micromotion mechanism includes
   a rotary mechanism for imparting a rotation to the distal end portion of the sample holder,
   a horizontal micromotion mechanism for imparting to the distal end portion a micromotion directed along a lateral surface of the sliding cylinder, and a microswinging motion mechanism for swinging the distal end vertically and horizontally about a central axis of the sample holder.

10. The sample micromotion mechanism according to claim 8, wherein the strain measuring unit is configured to:
   include a Wheatstone bridge circuit including a resistor of the strain measuring unit as one of constituent elements of the circuit, and three resistors as other constituent elements of the circuit; and
   counteract an amount of the strain in accordance with an output of the Wheatstone bridge circuit.

11. The sample micromotion mechanism according to claim 8, wherein:
   the strain measuring unit includes a Wheatstone bridge circuit constituted at least by two resistors and two resistance strain sensors, each of the four circuit elements being formed on a semiconductor substrate.

12. The sample micromotion mechanism according to claim 11, wherein:
   on a semiconductor substrate including a (001) crystal plane, the two resistance strain sensors and the two resistors are formed in such a fashion that the two resistance strain sensors are placed between the two resistors;
   on each of the two resistance strain sensors, a parallelogram pattern with length in a <110> direction confronts an equivalent parallelogram pattern of the other, with a p-type impurity being diffused over each of the patterns; and
   the two resistors are each formed so as to form a V-shaped pattern and so that a linear section forming the parallelogram pattern has length in a <100> direction or in a direction of a corresponding family, with a p-type impurity being diffused over the pattern.

13. The sample micromotion mechanism according to claim 11, wherein:
   on a semiconductor substrate including a (001) crystal plane, the two resistance strain sensors and the two resistors are formed in such a fashion that the two resistance strain sensors are placed between the two resistors;
   on each of the two resistance strain sensors, parallelogram patterns each with length in a <100> direction are formed in parallel, with an n-type impurity being diffused over each of the patterns; and
   on each of the two resistors, a parallelogram pattern with length in a <110> direction confronts an equivalent parallelogram pattern of the other, with an n-type impurity being diffused over each of the patterns.

14. The sample micromotion mechanism according to claim 11, wherein:
   on a semiconductor substrate including a (001) crystal plane, the two resistance strain sensors and the two resistors are formed in such a fashion that the two resistance strain sensors and the two resistors are parallel to each other;
   on each of the two resistance strain sensors, parallelogram patterns each with length in a <110> direction are formed in parallel, with a p-type impurity being diffused over each of the patterns; and
   on each of the two resistors, a parallelogram pattern with length in a <110> direction confronts an equivalent parallelogram pattern of the other, with an n-type impurity being diffused over each of the patterns.

15. A method of using a sample micromotion mechanism which includes
   a sample holder for supporting a sample observed through a charged particle device,
   a sliding cylinder accommodating the sample holder,
   a micromotion mechanism for imparting a micromotion to a distal end portion of the sample holder supporting the sample, the micromotion mechanism including
      a rotary mechanism for imparting a rotation to the distal end portion of the sample holder,
      a horizontal micromotion mechanism for imparting to the distal end portion a micromotion directed along a lateral surface of the sliding cylinder, and
      a microswinging motion mechanism for swinging the distal end vertically and horizontally about a central axis of the sample holder, and
   a strain measuring unit disposed to measure strain occurring between the sliding cylinder and the micromotion mechanism, the method comprising:
   (1) operating the sample micromotion mechanism and positioning the sample holder;
   (2) stopping the operation of the sample micromotion mechanism after the positioning;
   (3) blocking a charged particle beam generated by the charged particle device;
   (4) activating the rotary mechanism to minimize the strain caused by deformation of the sliding cylinder;
   (5) activating the microswinging motion mechanism to swing the distal end vertically and horizontally for minimizing the strain caused by the deformation of the sliding cylinder;
   (6) activating the horizontal micromotion mechanism to impart micromotion in a horizontal direction for minimizing the strain caused by the deformation of the sliding cylinder;
   (7) minimizing the strain caused by the deformation of the sliding cylinder; and
   (8) releasing a blocked state of the charged particle beam.

* * * * *